(12) United States Patent
Hosomi et al.

(10) Patent No.: US 6,879,514 B2
(45) Date of Patent: Apr. 12, 2005

(54) MAGNETORESISTIVE ELEMENT AND MAGNETIC MEMORY UNIT

(75) Inventors: Masanori Hosomi, Miyagi (JP); Kazuhiro Bessho, Kanagawa (JP); Kazuhiro Ohba, Miyagi (JP); Tetsuo Mizuguchi, Kanagawa (JP); Yutaka Higo, Miyagi (JP); Takeyuki Sone, Miyagi (JP); Tetsuya Yamamoto, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 21 days.

(21) Appl. No.: 10/673,025

(22) Filed: Sep. 26, 2003

(65) Prior Publication Data

US 2004/0136232 A1 Jul. 15, 2004

(30) Foreign Application Priority Data

Sep. 30, 2002 (JP) .................................... P2002-286560

(51) Int. Cl.$^7$ ................................................ G11C 11/00
(52) U.S. Cl. ........................ 365/158; 365/171; 365/173
(58) Field of Search ................................ 365/158, 171, 365/173, 163

(56) References Cited

U.S. PATENT DOCUMENTS

| 6,480,411 B1 | * | 11/2002 | Koganei ..................... 365/158 |
| 6,567,246 B1 | * | 5/2003 | Sakakima et al. ..... 360/324.11 |
| 2002/0176277 A1 | * | 11/2002 | Bessho et al. .............. 365/171 |

* cited by examiner

Primary Examiner—Michael S. Lebentritt
Assistant Examiner—Toan Le
(74) Attorney, Agent, or Firm—Sonnenschein, Nath & Rosenthal LLP

(57) ABSTRACT

In a magnetoresistive element which includes at least a pair of ferromagnetic layers stacked with having an intermediate layer inbetween and achieves a change in the magnetic resistance by permitting a current to flow in the direction which crosses the plane of the stacked layers, by virtue of having a construction wherein at least one ferromagnetic layer constituting an information recording layer has an amorphous structure containing a CoFeB or CoFeNiB alloy and has a plane form having a longer axis in one direction wherein both sides thereof along the longer axis direction form a straight line or a curved outward, and the both ends thereof in the longer axis direction form a curved or bent outward from, wherein the pattern form has an aspect ratio of 1:1.2 to 1:3.5, excellent asteroid curve having consistency in the properties can be stably obtained.

6 Claims, 9 Drawing Sheets

MAGNETORESISTIVE ELEMENT AND MAGNETIC MEMORY UNIT

CROSS REFERENCE TO RELATED APPLICATIONS

The present document is based on Japanese Priority Document JP2002-286560, filed in the Japanese Patent Office on Sep. 30, 2002, the entire contents of which being incorporated herein by reference.

BACKGROUND OF THE INVENTION

1. Field of the Invention

The present invention relates to a magnetoresistive element which can be used as, for example, a magnetic sensor or a magnetic memory device, and more particularly to a magnetoresistive element which achieves a change in the magnetic resistance by permitting an electric current to flow in the direction which crosses the plane of the multilayer films constituting the magnetoresistive element, and a magnetic memory unit.

2. Description of Related Art

In accordance with the rapid spreading of information communication appliances, especially personal small appliances, such as portable terminals, with respect to devices constituting these appliances, such as memory and logic, there are increasing demands of further improvement of the performance, e.g., an increase of the degree of integration, an increase of the operation speed, and lowering of the electric power needed. Particularly, an increase of the density and capacity of a nonvolatile memory is becoming more important as a technique of a substitute for a hard disc and an optical disc, which are essentially impossible to be downsized due to existence of the moving part.

As examples of nonvolatile memories, there can be mentioned a flash memory using a semiconductor and a ferroelectric random access memory (FRAM) using a ferroelectrics. However, the flash memory has a problem in that the write time is as long as a time of microsecond order. On the other hand, in the FRAM, a problem in that the rewritable ability is poor has been pointed out.

As a nonvolatile memory free of these problems, a magnetic memory device called magnetic random access memory (hereinafter, frequently referred to simply as "MRAM") has attracted attention (see Non-patent document 1).

The MRAM has a simple structure and hence is easy to increase the degree of integration. In addition, the storage for the MRAM is made by rotation of a magnetic moment, and therefore the MRAM has a feature such that the rewritable ability is extremely excellent. Further, it is expected that the MRAM can considerably speed up in the access time, and it has already been confirmed that the MRAM can operate at an access time in the order of nanosecond.

As a magnetoresistive element constituting a memory device in the MRAM, there is a tunnel magnetoresistance (hereinafter, frequently referred to simply as "TMR") element. The TMR element has a basic structure which is a ferromagnetic layer/tunnel barrier layer/ferromagnetic layer laminated structure. An external magnetic field is applied to the TMR element in a state such that a predetermined electric current flows a pair of ferromagnetic layers having a tunnel barrier layer disposed therebetween, so that a magnetoresistance effect appears according to the relative angle between the magnetizations in the ferromagnetic layers. Specifically, in this case, when the magnetizations in the individual ferromagnetic layers are non-parallel, the resistance value is maximum, whereas, when they are parallel, the resistance value is minimum. Therefore, in the TMR element, by creating the above parallel and non-parallel magnetization states using an external magnetic field, a change in the resistance value is caused to achieve recording of information, so that the TMR element can function as a memory device.

Especially in a spin-valve TMR element, one of the pair of ferromagnetic layers is disposed so that it is adjacent to an antiferromagnetic layer, and the ferromagnetic layer is antiferromagnetically connected to the antiferromagnetic layer to fix the direction of the magnetization in a predetermined direction, thus forming a fixed magnetization layer. Then, the other ferromagnetic layer is a magnetization unfixed layer which easily undergoes inversion of the magnetization due to an external magnetic field or the like, and this magnetization unfixed layer is used as a information recording layer in the magnetic memory unit.

When the individual spin polarizabilities of the pair of ferromagnetic layers are taken as P1 and P2, the rate of change in the resistance value in the spin-valve TMR element is represented by the following formula (1):

$$2P1 \times P2/(1 - P1 \times P2) \qquad (1)$$

The larger the spin polarizabilities P1, P2 of the ferromagnetic layers, the larger the rate of change in the resistance. With respect to the relationship between the rate of change in the resistance and the materials for the ferromagnetic layers, reports have already been made on ferromagnetic elements of the iron group, such as Fe, Co, and Ni, and metal alloys of these.

By the way, an MRAM has a basic construction including a plurality of bit write lines (so-called bit lines), a plurality of word write lines (so-called word lines) which are individually perpendicular to the plurality of bit lines, and TMR elements as magnetic memory devices disposed in portions at which the bit lines and the word lines spatially cross. Recording in the MRAM is made by selective writing for the TMR element utilizing the asteroid characteristics shown in FIG. 11 (see, for example, Patent document 1).

Specifically, a predetermined current is permitted to selectively flow the bit lines and the word lines, and an inverted external magnetic field due to synthesis of the induced magnetic fields generated in the perpendicular direction is applied to the TMR element selected, so that the direction of the magnetization in the magnetization unfixed layer, i.e., information recording layer is parallel to or non-parallel to the direction of the magnetization in the magnetization fixed layer, thus achieving recording of, for example, "0", "1".

As a conductive material for the bit lines and word lines in the MRAM, a wiring material for use in general semiconductor device, such as Cu, or a conductive thin film of Al or the like is used. When writing on a magnetic memory device having bit lines and word lines with a line width of 0.25 $\mu$m comprised of a general wiring material and having an inverted magnetic field Hc of, for example, 20 Oe, an electric current of about 2 mA is needed. When each of the bit lines and the word lines has a thickness of 0.25 $\mu$m which is the same as the line width, the current density is $3.2 \times 10^6$ A/cm$^2$, which is close to the limit of burnout caused by electromigration.

Therefore, for maintaining the reliability of wiring, it is essential to lower the write current. In addition, from the viewpoint of preventing a problem of heat generation due to the write current and lowering the electric power consumed, it is required to lower the write current. For lowering the write current in the MRAM, it is necessary to lower the coercive force (inverted magnetic field) of the TMR element.

FIG. 11 is a so-called asteroid curve showing inverted magnetic field characteristics of the information recording layer of a TMR element constituting a memory device in an MRAM. The asteroid curve shown in FIG. 11 is an ideal asteroid curve. That is, this asteroid curve has a slenderness ratio of 1, and exhibits characteristics such that the curve form is arched.

In this asteroid curve, the ordinate is taken as the direction of difficult magnetization axis, and the abscissa is taken as the direction of easy magnetization axis, and the MRAM exhibits inverted magnetic field characteristics such that a magnetic field Hy in the direction of difficult magnetization axis generated by permitting a current to flow the word line selected and a magnetic field (auxiliary magnetic field) Hx in the direction of easy magnetization axis generated by permitting a current to flow the bit line selected are applied to the TMR element placed in a portion at which the selected word line and bit line cross, so that one ferromagnetic layer constituting the information recording layer in the TMR element undergoes inversion of the magnetization. When it is presumed that the inversion of the magnetization is caused by spin rotation, the inverted magnetic field characteristics show a curve which changes according to an asteroid curve: $Hx^{2/3}+Hy^{2/3}=Hk^{2/3}$ (wherein Hk represents an anisotropic magnetic field) due to the synthesized current magnetic field caused by the perpendicular word and bit lines. In other words, no inversion of the magnetization occurs when $Hx^{2/3}+Hy^{2/3}<Hk^{2/3}$, and inversion of the magnetization occurs when $Hx^{2/3}+Hy^{2/3}>Hk^{2/3}$.

As mentioned above, an ideal, i.e., excellent asteroid curve has a slenderness ratio of 1. When the slenderness ratio of the asteroid curve and 1 is greatly displaced, the difference in value between the inverted magnetic field and the auxiliary magnetic field required for writing is large, so that the balance between the current flowing the word line and the current flowing the bit line is poor.

Further, it is desired that the asteroid curve is arched and has a smaller curvature radius. The reason for this is as follows. When the asteroid curve is arched, the rate of change in the inverted magnetic field in respect of the auxiliary magnetic field is large, namely, the rate of change in the coercive force, i.e., inverted magnetic field from, for example, a state such that no auxiliary magnetic field is applied to a state such that a predetermined magnetic field Hsub is applied is large, and hence the sensitivity in the of the auxiliary magnetic field direction is high.

Specifically, as shown in FIG. 11, when a predetermined auxiliary magnetic field Hsub is applied, the curvature is gentle as indicated by a broken line curve $As_1$ (shown only in the first quadrant in FIG. 11). When the curve is nearly a straight line, the inverted magnetic field Hc is reduced to $Hc_1$ in respect of a certain auxiliary magnetic field Hsub, but the rate of change in the inverted magnetic field Hc is small, as compared to the rate of change in the solid line curve $As_0$ having a sharp curvature, i.e., a small curvature radius, namely, the inverted magnetic field $Hc_0$ when the auxiliary magnetic field Hsub is applied. In other words, when the asteroid curve becomes linear, the sensitivity for the auxiliary magnetic field is lowered and the auxiliary magnetic field is required to increase for obtaining the change of the inverted magnetic field, so that the write current in the MRAM is increased, leading to an increase of the electric power consumed.

In addition, from a comparison between the writable regions, i.e., so-called window areas individually defined by asteroid curves $As_0$, $As_1$ and a broken line "a" indicating the maximum region of the magnetic fields Hx, Hy, it is apparent that, when the asteroid curve becomes linear, the writable region is smaller. Further, when there is a lack of consistency in the asteroid characteristics of each memory device, i.e., TMR element, the asteroid curve is not comprised of one curve shown in FIG. 11 but a number of curves, and hence the width of the curve becomes substantially broad, so that the window area is further smaller and the selective writing is difficult, thus increasing the write error.

By the way, for improving the MRAM in the recording density and increasing the degree of integration of the MRAM, it is necessary to downsize the TMR element, but, when the TMR element is downsized, inversion of the magnetization is unlikely to occur, so that the inverted magnetic field Hc must be increased. Therefore, there is a dilemma that it is difficult to downsize the MRAM, namely, increase the degree of integration of the MRAM while lowering the write current.

Further, in the MRAM, when there is no consistency in the magnetic properties of TMR elements as memory devices, or there is no consistency in the magnetic properties of the same element upon repetition of the operation, the selective writing utilizing the asteroid characteristics described with reference to FIG. 11 is difficult, causing a problem in that the write error is increased.

Thus, the TMR element is needed to exhibit an ideal asteroid curve. For exhibiting an ideal asteroid curve, it is necessary that the resistance-magnetic field (hereinafter, frequently referred to as "R-H") curve obtained by TMR measurement be free of a noise, such as Barkhausen noise, and have excellent squareness and an inverted magnetic field Hc which is stable and has consistency.

On the other hand, with respect to the reading of information in the TMR element, a state of a higher resistance value in which the magnetic moments of the information recording layer and the magnetization fixed layer having the tunnel barrier layer disposed therebetween are non-parallel, for example, "1", and a state of a lower resistance value in which the magnetic moments are parallel, for example, "0", are read by detecting a voltage difference, for example, at a constant bias voltage. Therefore, when the dispersion of the resistance between the elements is the same and the TMR ratio is higher, a memory device having a high speed and a high degree of integration as well as low error rate can be realized.

In addition, it has been known that the rate of change in the resistance in the TMR element has dependency on the bias voltage, and, when the bias voltage rises, the TMR ratio is reduced. Further, in the reading made by the current difference or voltage difference, in many cases, it has been known that the reading signal is maximum at a voltage Vhalf where the rate of change in the resistance is reduced by half due to the bias voltage dependency, and therefore, smaller bias voltage dependency is effective to lower the read error.

[Non-Patent Document 1]
Wang et al., IEEE Trans. Magn. 33 (1997), 4498
[Patent Document 1]
Japanese Patent Laid-Open Publication No. 10-116490

As mentioned above, in the TMR element used in the MRAM, it is necessary that both the above-mentioned write properties requirement and read properties requirement be satisfied. However, when the materials for the ferromagnetic layer in the TMR element are selected from the alloy composition comprised solely of ferromagnetic transition metal elements, such as Co, Fe, and Ni, so that the spin polarizabilities represented by P1 and P2 in formula (1) are larger, the inverted magnetic field Hc in the TMR element is generally likely to increase.

For example, when, for example, a $CO_{75}Fe_{25}$ (atm.%) alloy is used in the information recording layer, the spin polarizabilities are large and a TMR ratio as large as 40% or more can be secured, but the inverted magnetic field Hc is high. By contrast, a $Ni_{80}Fe_{20}$ (atm.%) alloy called Permalloy known as a soft magnetic material is used in the information recording layer, the inverted magnetic field Hc can be lowered, but the spin polarizabilities are small, as compared to those in the above $Co_{75}Fe_{25}$ (atm.%) alloy, and thus the TMR ratio is as low as about 33%. A $Co_{90}Fe_{10}$ (atm.%) alloy is advantageous not only in that a TMR ratio of about 37% can be obtained, but also in that the inverted magnetic field Hc can be lowered to an intermediate value between that of the $Co_{75}Fe_{25}$ (atm.%) alloy and that of the $Ni_{80}Fe_{20}$ (atm. %) alloy, but the squareness ratio of the R-H curve is poor, so that asteroid characteristics enabling writing cannot be obtained. In addition, a problem arises in that the inverted magnetic field in the information recording layer in each element is not stabilized.

SUMMARY OF THE INVENTION

In the present invention, there are provided a magnetoresistive element having a ferromagnetic layer which is comprised of a specific material and has a pattern form selected to improve both the write properties and the read properties, and a magnetic memory unit.

The present invention provides a magnetoresistive element used as a magnetic sensor or a memory device in an MRAM, wherein the magnetoresistive element includes at least a pair of ferromagnetic layers stacked having with an intermediate layer inbetween so as to face each other, and achieves a change in the magnetic resistance by permitting an electric current in the direction which crosses the plane of the stacked layers, specifically in the direction substantially perpendicular to the plane of the stacked layers.

In the present invention, at least one of the ferromagnetic layers constituting an information recording layer is an alloy layer having an amorphous structure containing either a CoFeB alloy or a CoFeNiB alloy. Further, in the present invention, the information recording layer has a plane form having a longer axis in one direction wherein both sides of the plane form along the longer axis direction form one of a straight line and an outward protrusion, and the both ends of the plane form in the longer axis direction form an outward protrusion, thereby forming a pattern form. In addition, the pattern form has an aspect ratio in the range of 1:1.2 to 1:3.5, in terms of shorter axis length: longer axis length.

The magnetic memory unit of the present invention has a word line and a bit line which spatially cross, and includes a magnetoresistive element constituting a memory device in a portion at which the word line and the bit line spatially cross. This magnetoresistive element is the above-described magnetoresistive element of the present invention, and a current is permitted to flow the selected word line and bit line to apply a predetermined magnetic field to the magnetoresistive element as a memory device in the crossing portion of the word and bit lines, thus achieving recording according to the direction of the magnetization in the information recording layer.

As mentioned above, in the magnetoresistive element of the present invention, the information recording layer is an alloy layer having an amorphous structure containing a CoFeB alloy or a CoFeNiB alloy, the information recording layer has a plane form having a longer axis in one direction wherein both sides of the plane form along the longer axis direction form one of a straight line and an outward protrusion, and the both ends of plane form in the longer axis direction from an outward protrusion, thereby forming a pattern form, and further the pattern form has an aspect ratio in the range of 1:1.2 to 1:3.5, in terms of shorter axis length:longer axis length. It has been found that, by virtue of having this construction, excellent asteroid curve can be formed and excellent asteroid characteristics having consistency can be stably formed.

Specifically, when the ferromagnetic layer constituting an information recording layer is comprised of an amorphous layer, an increase of the inverted magnetic field Hc due to reduction in size of the element, namely, reduction in size of the shorter axis can be avoided. Especially an amorphous layer comprised of a CoFeB alloy or an alloy containing a CoFeNiB alloy and an alloying element exhibits a larger TMR ratio and has high magnetic anisotropy, but it can improve the sensitivity in the direction of the auxiliary magnetic field, that is, it can render the curvature of the asteroid curve sharp. Further, when the plane form of the information recording layer has a longer axis in one direction and the ratio of the longer axis to the shorter axis (longer axis/shorter axis) is 1.2 to 3.5, the information recording layer has a predetermined form anisotropy and is prevented from suffering inversion of the magnetization, thus making it possible to obtain excellent asteroid curve.

The magnetoresistive element of the present invention and a magnetic memory device using the magnetoresistive element as a memory device have advantages as follows. The squareness ratio in the R-H characteristics is excellent, and the spin polarizability is improved while suppressing an increase in the coercive force, i.e., inverted magnetic field, and therefore a high TMR ratio can be obtained. In addition, a Barkhausen noise is suppressed, and there can be secured a writable region such that an asteroid curve having excellent properties of arched form can be stably obtained, so that stable write properties having a write error improved can be obtained. Further, when a higher TMR ratio is obtained, the bias dependency is lowered, and therefore, for example, a magnetic memory unit having such excellent read properties that the error is improved in reading of the recording information to achieve stable reading can be fabricated.

Thus, a magnetoresistive element and a magnetic memory unit having excellent write and read properties can be stably fabricated, leading to great commercial and practical benefit.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

Figure 2:
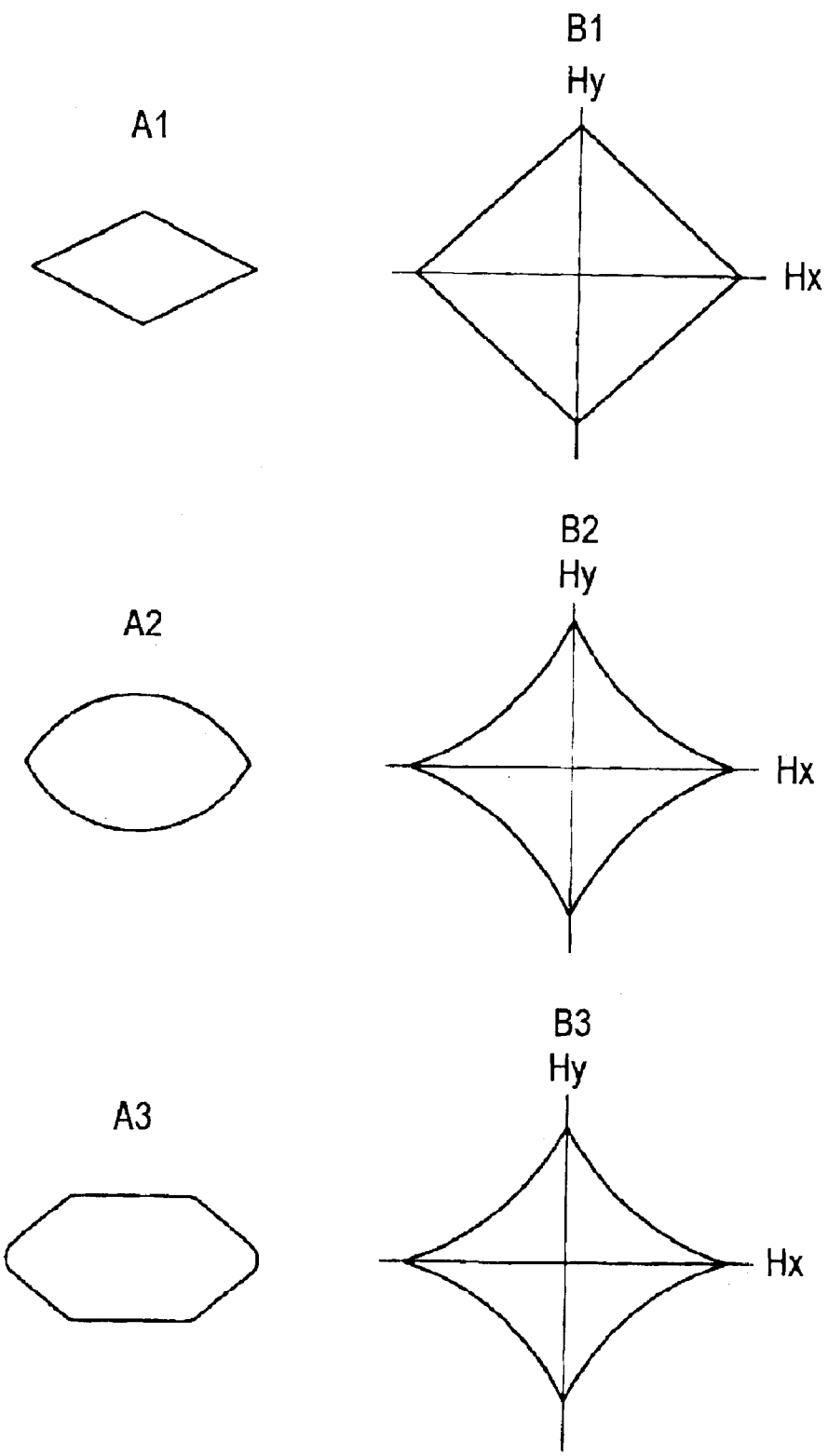
Figure 3:
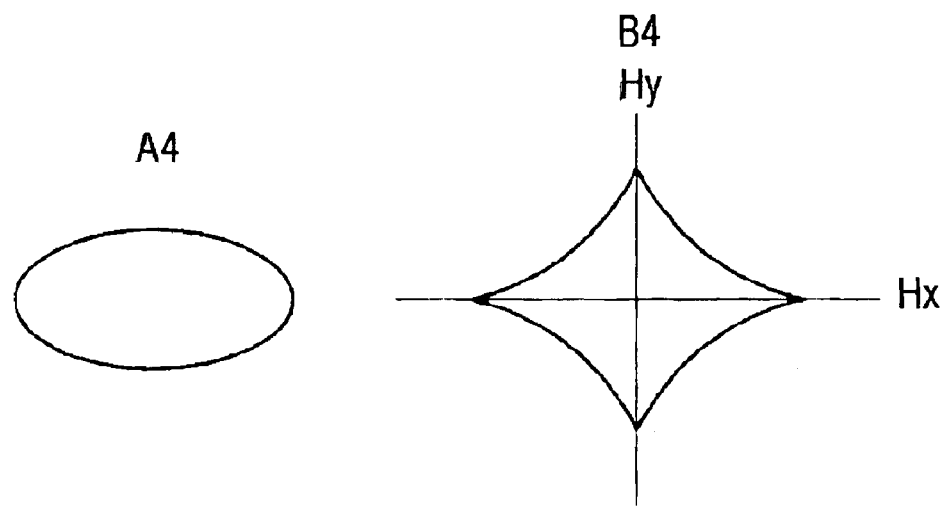
Figure 3:
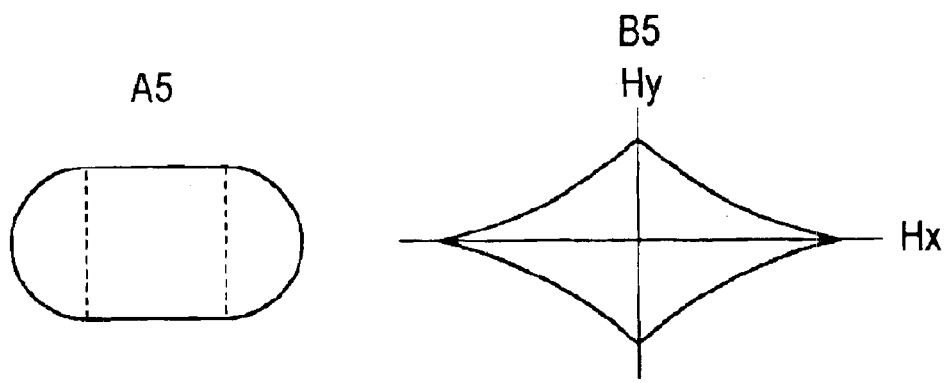
Figure 3:
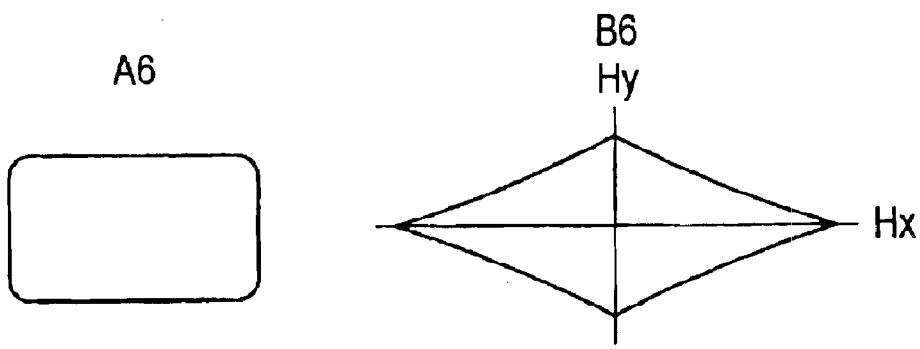
Figure 4:
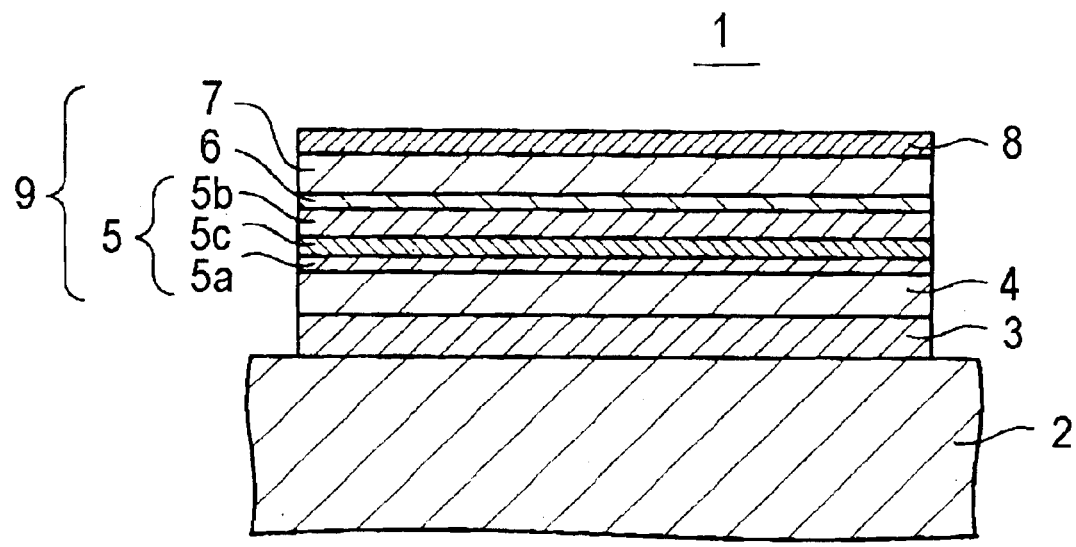
Figure 5:
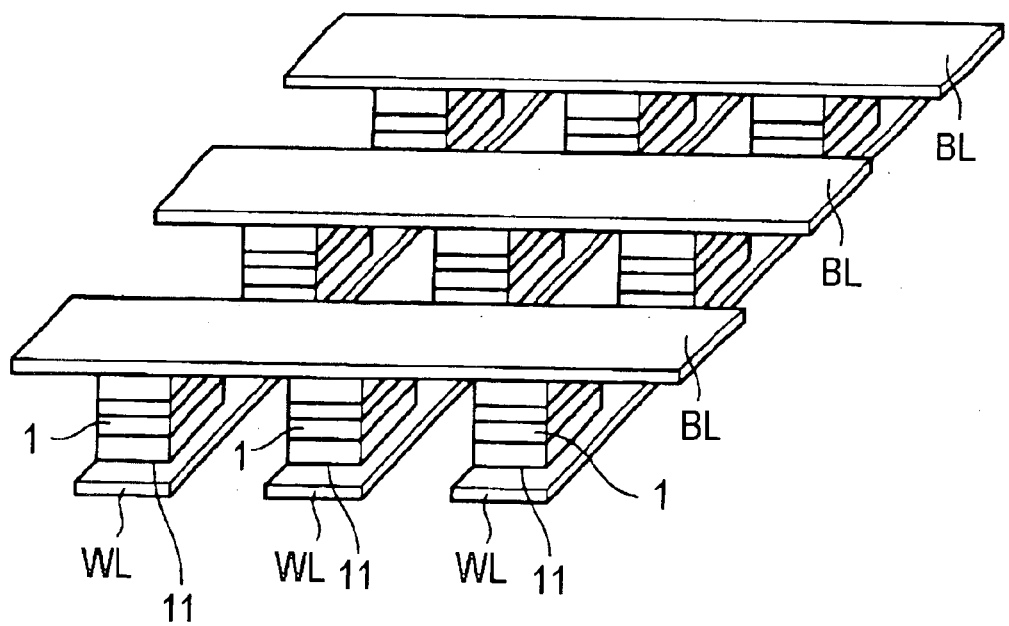
Figure 6:
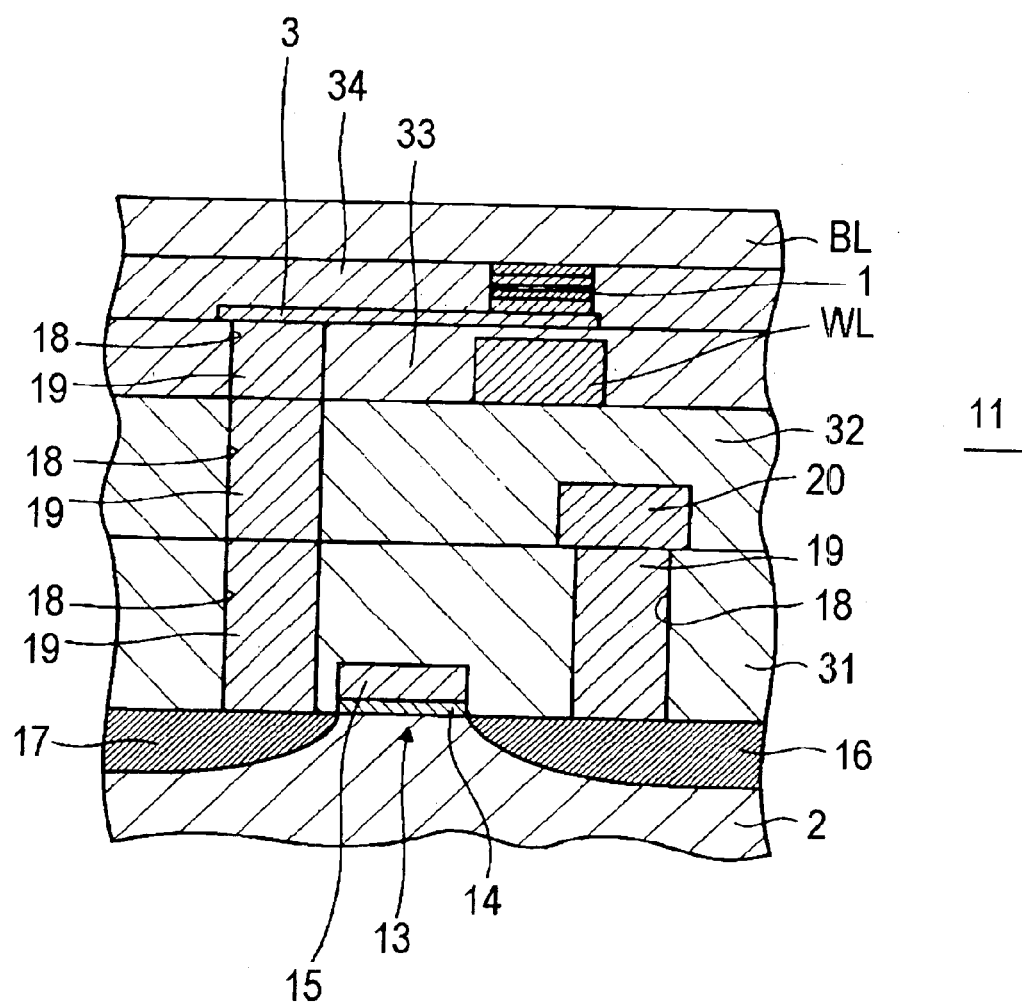
Figure 7:
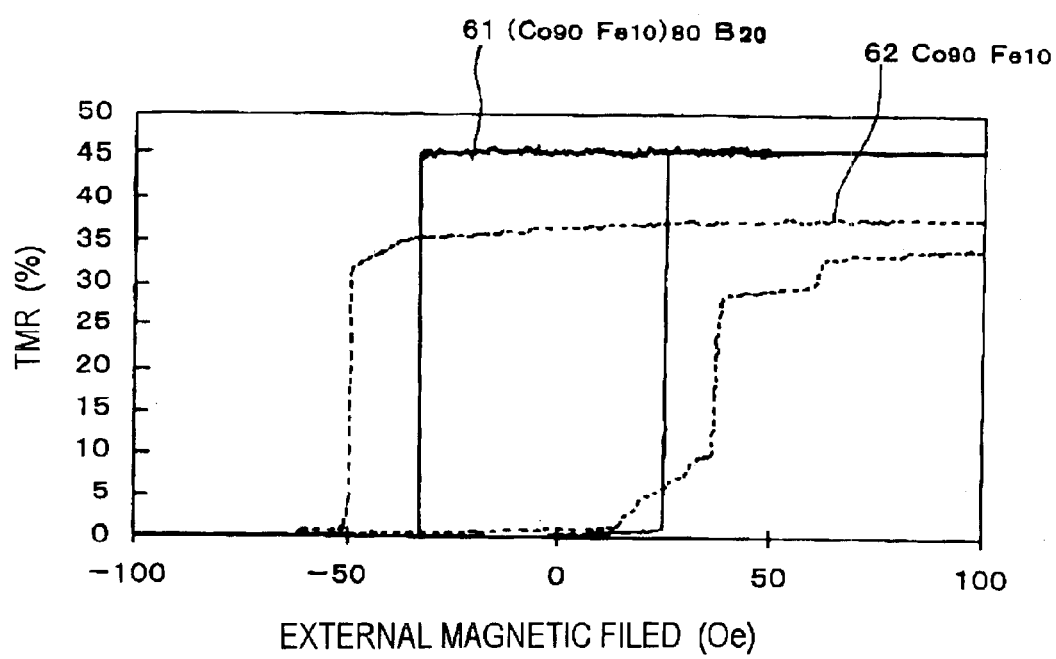
Figure 8:
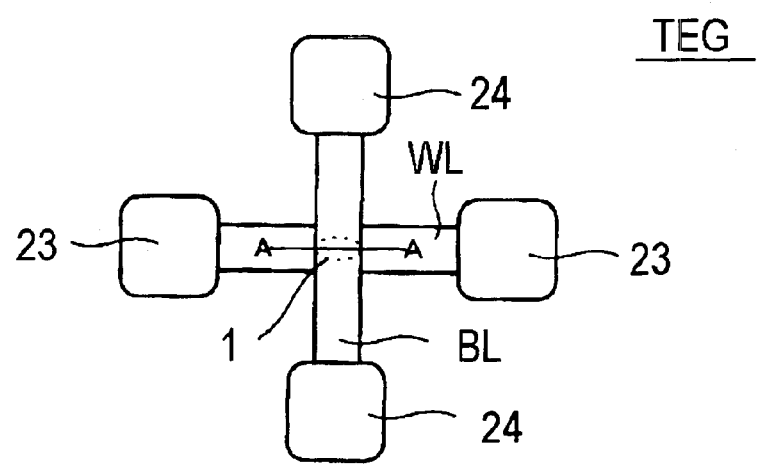
Figure 9:
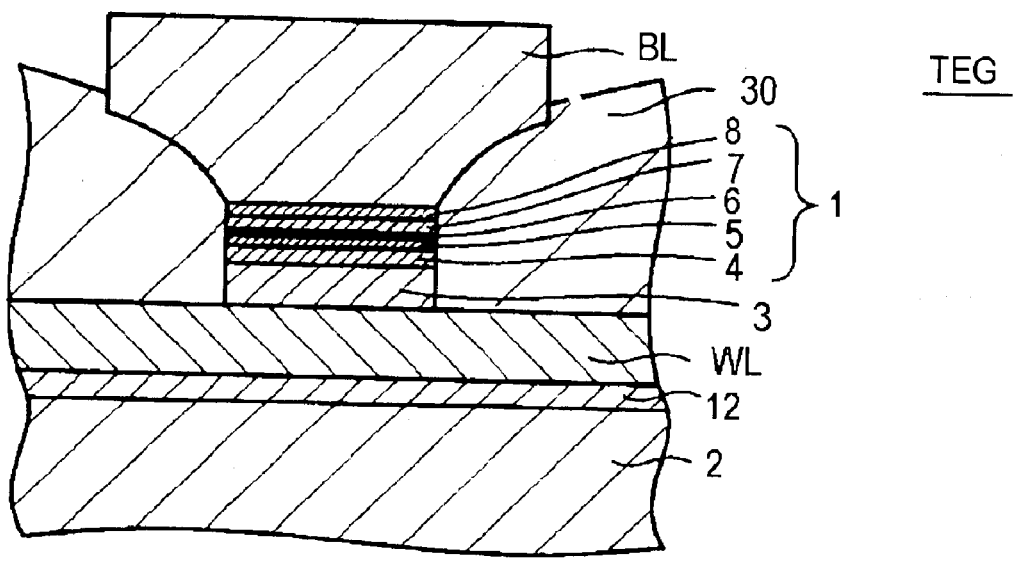
Figure 10:
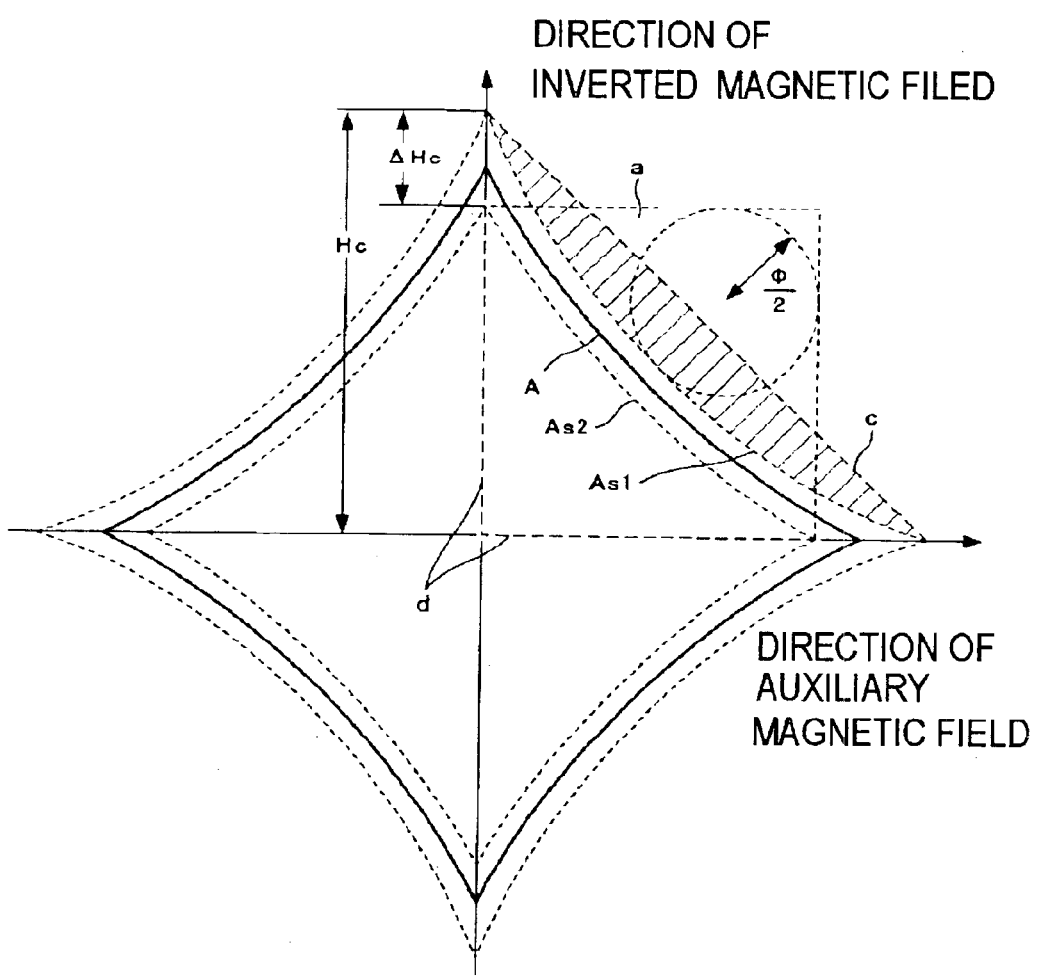
Figure 11:
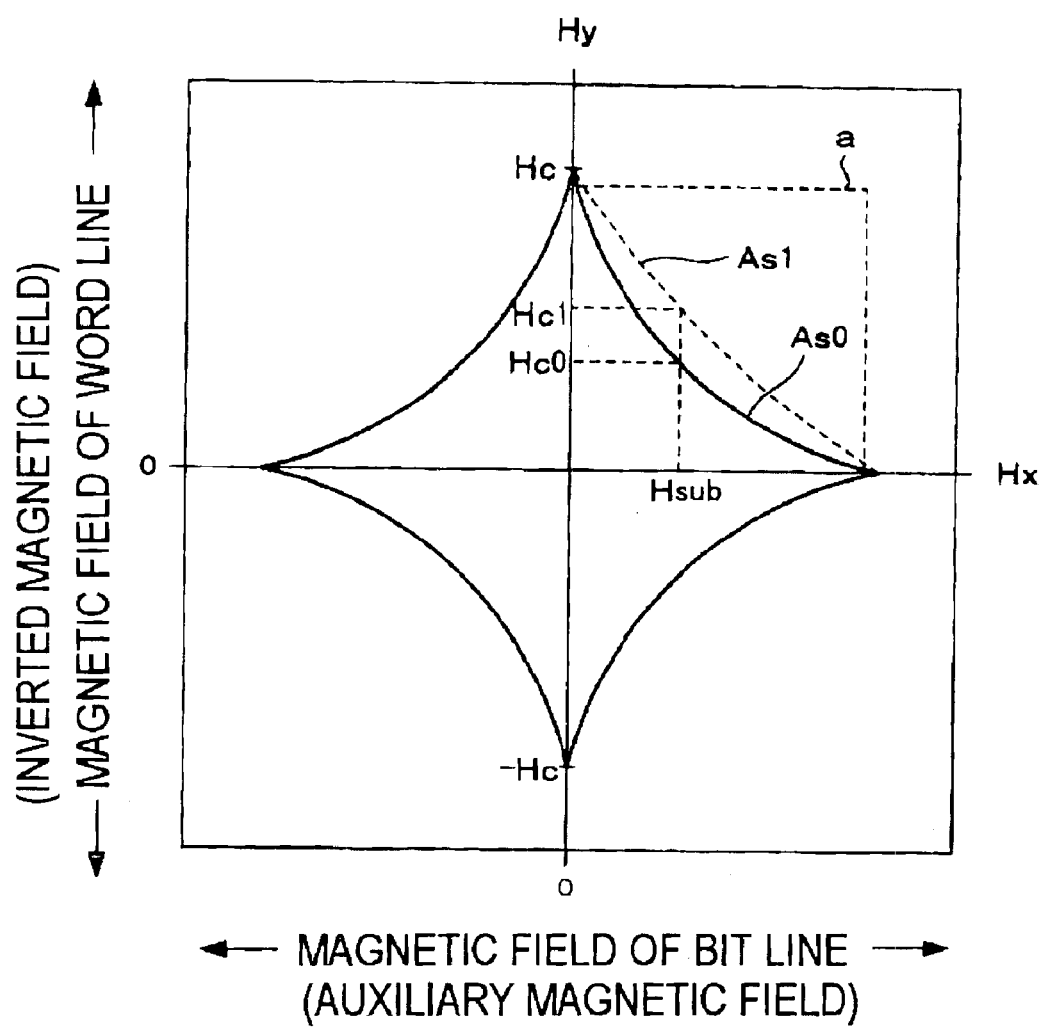

A1 to A3 of FIG. 2 are diagrammatic plane patterns of the information recording layer in the magnetoresistive element of the present invention, and B1 to B3 of FIG. 2 are diagrammatic asteroid curves corresponding to the plane patterns;

A4 to A6 of FIG. 3 are diagrammatic plane patterns of the information recording layer in the magnetoresistive element of the present invention, and B4 to B6 of FIG. 3 are diagrammatic asteroid curves corresponding to the plane patterns;

FIG. 4 is a diagrammatic cross-sectional view of another form of a magnetoresistive element of the present invention;

FIG. 5 is a diagrammatic perspective view illustrating the construction of one form of a magnetic memory unit of the present invention;

FIG. 6 is a diagrammatic cross-sectional view of one form of a memory cell in the magnetic memory unit of the present invention;

FIG. 7 shows TMR measurement curves against the external magnetic field with respect to a TMR element of the present invention and a conventional TMR element;

FIG. 8 is a diagrammatic plan view of an element for evaluation of the properties (TEG) for explaining the Examples of the present invention and Comparative Examples;

FIG. 9 is a diagrammatic cross-sectional view of the element for evaluation of the properties (TEG);

FIG. 10 shows asteroid curves for explaining the evaluation of the properties and FIG. 11 is an explanatory view illustrating an ideal asteroid curve.

DESCRIPTION OF THE PREFERRED EMBODIMENTS

Magnetoresistive Element

The magnetoresistive element according to one embodiment of the present invention is a magnetoresistive element as a memory device for use in a magnetic memory unit, but the magnetoresistive element is not limited to this embodiment.

The magnetoresistive element of the present invention has a so-called current perpendicular to plane (CPP) construction having a laminated structure portion comprising at least a pair of ferromagnetic layers, specifically, an information recording layer as a magnetization unfixed layer and a magnetization fixed layer which are stacked through an intermediate layer, and, by permitting an electric current to flow the element in the direction perpendicular to the plane of the laminated structure portion, i.e., in the thicknesswise direction to cause a change in the magnetic resistance.

In the pair of ferromagnetic layers, at least the ferromagnetic layer constituting an information recording layer (magnetization unfixed layer) is comprised of a FeCoB or FeCoNiB amorphous layer containing at least Fe and Co, which are ferromagnetic transition metal elements, as well as B wherein the amorphous layer is formed from, for example, a sputtering film. In the TMR element, the intermediate layer is constituted by a tunnel barrier layer.

The plane form of at least the information recording layer, for example, the plane form of the magnetoresistive element has a longer axis in one direction wherein both sides of the plane form along the longer axis direction from a straight line or an outward protrusion, and the ends of the plane form in the longer axis direction form a curved or bent outward form, thereby forming a pattern form. The pattern form may have symmetry with respect to the center axis in each of the longer axis direction and the shorter axis direction. Further, in the pattern form, the aspect ratio is selected to fall in the range of 1:1.2 to 1:3.5, in terms of shorter axis length:longer axis length. The pair of ferromagnetic layers can be individually of either a single-layer structure or a multi-layer structure. For example, the ferromagnetic layer constituting the magnetization fixed layer can be of a laminated ferri structure.

Figure 1:
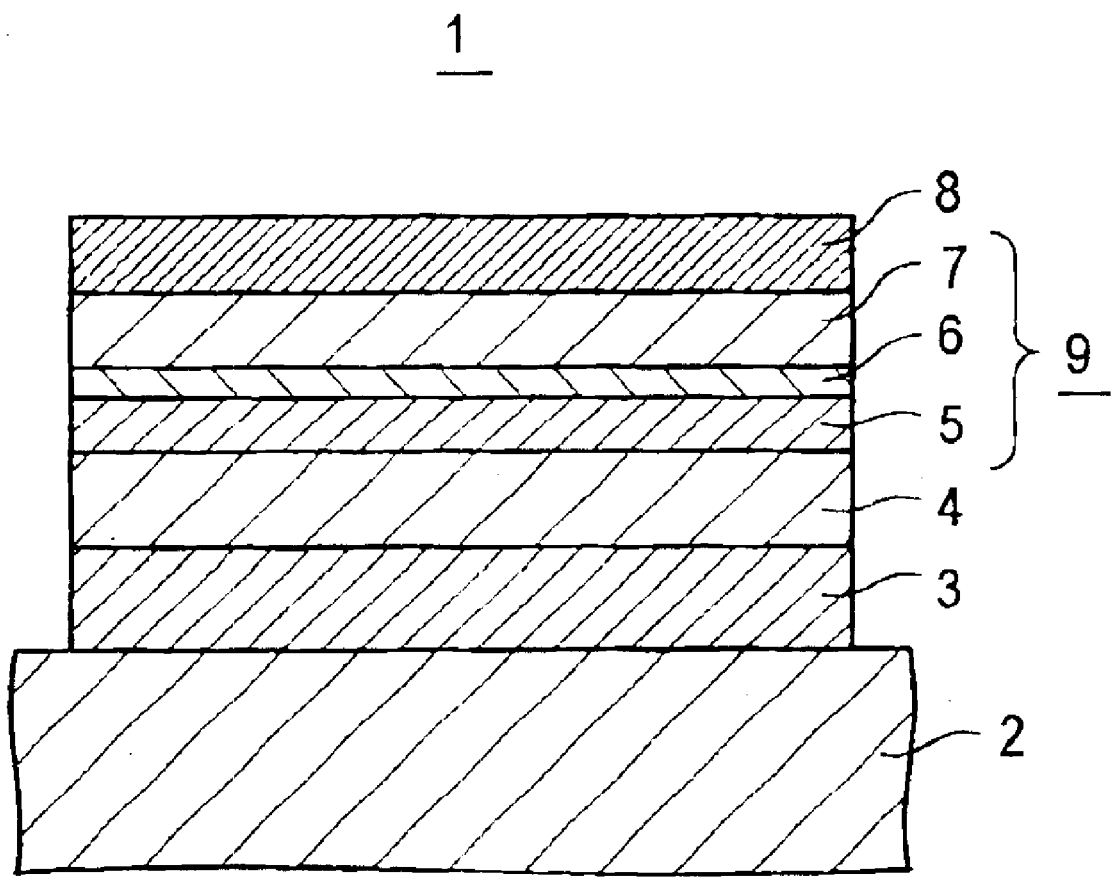
FIG. 1 is a diagrammatic cross-sectional view of one form of a magnetoresistive element of the present invention.

FIG. 1 shows a diagrammatic cross-sectional view of one form of the magnetoresistive element, for example, a spin-valve TMR element 1.

In this example, the element has a laminated structure such that a primary coat layer 3 is formed on a substrate 2, e.g., a Si substrate, an antiferromagnetic layer 4 is formed on the primary coat layer 3, and on the antiferromagnetic layer 4 are formed a pair of a ferromagnetic layer 5 constituting a magnetization fixed layer and a ferromagnetic layer 7 constituting an information recording layer, which are stacked through an intermediate layer 6.

In this example, the ferromagnetic layer 5 constituting a magnetization fixed layer is formed on the antiferromagnetic layer 4, and the intermediate layer 6 constituting a tunnel barrier layer is formed on the ferromagnetic layer 5, and further on the intermediate layer 6 is formed the ferromagnetic layer 7 as a magnetization unfixed layer constituting an information recording layer, and this laminated structure constitutes a ferromagnetic tunnel junction structure portion (hereinafter, frequently referred to as "MTJ") 9. On the MTJ 9 is deposited a protecting layer 8, i.e., a so-called top coat layer.

The primary coat layer 3 is comprised of, for example, a tantalum (Ta) film which is a nonmagnetic conductive layer. The antiferromagnetic layer 4 is antiferromagnetically connected to the ferromagnetic layer 5 as a magnetization fixed layer, and hence the magnetization in the ferromagnetic layer 5 suffers no inversion due to a signal magnetic field applied from the outside, for example, a write magnetic field in a memory device, so that the direction of the magnetization in the ferromagnetic layer 5 constituting the magnetization fixed layer is set in a predetermined direction. The antiferromagnetic layer 4 may be comprised of a Mn alloy containing Fe, Ni, Pt, Ir, or Rh, Co oxide, or Ni oxide. The antiferromagnetic layer 4 in this case is comprised of, for example, PtMn.

The tunnel barrier layer as the intermediate layer 6 can be formed from an oxide film or a nitride film obtained by oxidizing or nitriding a metallic film, for example, an Al sputtering film or deposited film. Alternatively, the tunnel barrier layer 6 can be formed by a chemical vapor deposition (hereinafter, frequently referred to simply as "CVD") process using an organometal, and oxygen, ozone, nitrogen, halogen, or halide gas.

In the present invention, both the ferromagnetic layers 5, 7 which are stacked through the intermediate layer 6, especially at least the ferromagnetic layer 7 constituting an information recording layer is comprised of a ferromagnetic amorphous layer containing FeCoB or FeCoNiB, which is formed from, for example, a sputtering film.

Further, in the present invention, the plane pattern of at least the information recording layer, i.e., ferromagnetic layer 7, for example, the plane pattern of the stacked layers portion in the magnetoresistive element 1 is a form having a longer axis in one direction wherein both sides of the plane form along the longer axis direction form an outward protrusion or in a straight line, and the both ends of the plane form in the longer axis direction form an outward protrusion, thereby forming a pattern form. Examples of pattern forms are diagrammatically shown in A1 to A6 of FIGS. 2 and 3, and the pattern forms have symmetry with respect to the center axis of each of the longer axis and the shorter axis. For example, the pattern form may be in a rhombic form shown in A1 of FIG. 2 wherein both sides of the plane form along the longer axis direction and the both ends of the plane form in the longer axis direction form a bent outward or substantially bent form and an outward protrusion. Alternatively, the pattern form may be in a form such that both sides form a curved outward form, for example, a lemon-like form shown in A2 of FIG. 2, an elliptic form or an oval form shown in A4 of FIG. 3, or a not shown spindle form. The pattern form can be in a capsule form (A5 of FIG. 3) or a rectangular form (A6 of FIG. 3) such that the both outer sides are individually straight lines.

However, the present invention is not limited to the examples shown in A1 to A6 of FIGS. 2 and 3. In the present invention, in addition to the pattern form, the (shorter axis):(longer axis) ratio is selected to fall in the range of 1:1.2 to 1:3.5.

In the construction in the present invention, as mentioned above, at least the ferromagnetic layer 7 constituting an information recording layer, for example, both the ferromagnetic layers 5, 7 are made of an FeCoB or FeCoNiB material containing B so as to have an amorphous structure. By virtue of having this construction, the element can avoid a disadvantage that the increase in the spin polarizability in the formula (1) above causes the coercive force to be higher, as compared to an element having a ferromagnetic layer comprised solely of a crystalline metal.

That is, by virtue of containing a ferromagnetic material having an amorphous structure, the element can realize improvement of the spin polarizability, namely, improvement of the TMR ratio, and lowering of the coercive force, i.e., inverted magnetic field, namely, lowering of the write current. Further, the magnetic anisotropy indicated by the axis of difficult magnetization and the axis of easy magnetization in the ferromagnetic layer is controlled, so that the R (resistance)-H (magnetic field) curve has excellent squareness and the inverted magnetic field in the information recording layer can be stabilized.

In addition, in the present invention, as mentioned above, by controlling the plane pattern form of the information recording layer or the plane pattern form of the magnetoresistive element and the aspect ratio, an asteroid curve having excellent arch form can be obtained, thus making it possible to increase the writable range for the inverted magnetic field and the auxiliary magnetic field. In other words, the magnetoresistive element of the present invention exhibits a large TMR ratio and large magnetic anisotropy as mentioned above, but it has excellent sensitivity in the direction of the auxiliary magnetic field.

It is desired that the composition of CoFe or CoFeNi constituting the amorphous ferromagnetic layer falls in a range such that the element generally exhibits soft magnetic properties, and the composition can be one which is used in a general CoFe information recording layer or CoFeNi information recording layer. With respect to the B content, for forming an amorphous layer, 10 atm.% or more of B is required, and, conversely, for maintaining the magnetic properties, it is necessary that the B content be 35 atm.% or less.

For securing excellent magnetic properties, it is desired that the ferromagnetic layer 7 constituting an information recording layer has a thickness of 1 to 10 nm. The reason for this is as follows. When the thickness of the ferromagnetic layer 7 is less than nm, the magnetic properties of the ferromagnetic layer 7 as a magnetization unfixed layer may considerably deteriorate. On the other hand, when the thickness exceeds 10 nm, the coercive force may become too large, and, for example, when the element is used as a memory device in a magnetic memory unit, it may be inappropriate from a practical point of view.

The structure of the ferromagnetic layer 7 is not limited to the above-mentioned single-layer structure comprised of FeCoB or FeCoNiB, and the ferromagnetic layer 7 may have a laminated structure comprised of, for example, a ferromagnetic layer having the above composition and a NiFe layer having a magnetization amount smaller than that of the ferromagnetic layer, and, in this case, the total thickness of the laminated layers can be more than 10 nm.

When the magnetization fixed layer 5 is comprised of FeCoB or FeCoNiB, it is desired that the magnetization fixed layer 5 has a thickness of 0.5 to 6 nm. The reason for this is as follows. When the thickness of the magnetization fixed layer 5 is less than 0.5 nm, the magnetic properties suitable for the magnetization fixed layer may deteriorate. On the other hand, when the thickness exceeds 6 nm, a satisfactory magnetic field exchange-connected to the antiferromagnetic layer cannot be obtained.

In the alloy composition of FeCoB or FeCoNiB constituting the ferromagnetic layer, a preferred range is present. The present applicant has already proposed the ferromagnetic layer comprised of FeCoB or FeCoNiB in Japanese Patent Application No. 2002-106926. The ferromagnetic layer is subjected to treatment of annealing within a magnetic field to completely impart magnetic anisotropy into the ferromagnetic layer.

Next, the alloy composition of Fe, Co, and B contained in the ferromagnetic layer is described. It is preferred that, excluding unavoidable impurity elements, the Fe, Co, and B alloy composition is represented by the compositional formula: $Fe_xCo_yB_z$ (wherein each of x, y, and z represents atm. %) wherein $5 \leq x \leq 45$, $35 \leq y \leq 85$, and $10 \leq z \leq 30$. In this case, the relationship: $x+y+z=100$ is satisfied. The selection of the composition is described below.

First, the B content of the ferromagnetic layer is described. When the B content is less than 10 atm.%, the magnetic properties of an Fe—Co alloy as a base are largely reflected and only a small effect of improvement can be recognized. Therefore, the alloy having a B content of 10 atm.% or more remarkably increases in the TMR ratio and is improved in the squareness of the resistance-magnetic field (R-H) curve, as compared to an alloy having the same composition of Fe and Co. In addition, the bias dependency of the TMR ratio is improved, and further the magnetization state of the information recording layer is stable, and hence the coercive force has excellent consistency and a noise appearing on the R-H curve is considerably suppressed.

Further, it is preferred that the B content of the ferromagnetic layer is 30 atm.% or less. When the B content exceeds 30 atm.%, for example, the ferromagnetic properties of the information recording layer and the fixed magnetic field of the magnetization fixed layer may deteriorate. As a result, lowering of the TMR ratio, deterioration of the squareness of the R-H curve, and reduction in the coercive force may occur. Therefore, for surely obtaining the effect aimed at by adding B, it is desired that at least one of the ferromagnetic layers, e.g., the ferromagnetic layer 7 constituting the information recording layer has a composition having a B content of 10 to 30 atm.%, which varies depending on the composition of the Fe—Co alloy.

Next, the Fe—Co alloy as a base of the ferromagnetic layer is described. In the alloy composition including B, at least 35 atm.% of Co is needed for increasing the effect aimed at by adding B and maintaining the ferromagnetic properties. In this case, when Fe is present, like in the change caused in the Co—Fe base alloy, improvement of the TMR ratio and an increase of the coercive force are recognized. However, when the Fe content exceeds 45 atm.%, in an actual element dimension, the coercive force is over increased and is unsuitable for TMR element. On the other hand, when the Fe content is less than 5 atm.%, the spin polarizability of the ferromagnetic layer is too small, there is a possibility that a TMR ratio sufficient for a magnetoresistive element cannot be obtained. Therefore, the Fe content is preferably 5 to 45 atm.%.

The ferromagnetic layer may have a composition containing Ni, in addition to the above-mentioned Fe, Co, and B. When the ferromagnetic layer contains Ni, an effect to improve the squareness of the R-H curve while suppressing an increase of the coercive force and maintain excellent TMR ratio can be obtained. In this case, a preferred range of the Ni content is present. Specifically, the Ni content of the ferromagnetic layer is preferably 35 atm.% or less. The reason for this resides in that, when the Ni content of the ferromagnetic layer exceeds 35 atm.%, the coercive force may be too small, making it difficult to control the operation of the TMR element. Specifically, it is preferred that, excluding unavoidable impurity elements, the ferromagnetic layer comprised of FeCoNiB is represented by the compositional formula: $Fe_aCo_bNi_cB_d$ (wherein each of a to d represents atm.%) wherein $5 \leq a \leq 45$, $35 \leq b \leq 85$, $0 \leq c \leq 35$, and $10 \leq d \leq 30$. In this case, the relationship: $a+b+c+d=100$ is satisfied.

Next, the relationship between the plane form of the information recording layer or magnetoresistive element and the asteroid curve will be described with reference to FIGS. 2 and 3. As mentioned above, in FIGS. 2 and 3, A1 to A6 diagrammatically show plane pattern forms of the ferromagnetic layer 7 constituting an information recording layer or the magnetoresistive element 1, and B1 to B6 diagrammatically show the forms of the asteroid curves obtained, respectively, corresponding to the pattern forms shown in A1 to A6. As shown in FIGS. 2 and 3, the form of the asteroid curve can be controlled by appropriately selecting the plane pattern form of the ferromagnetic layer 7 or magnetoresistive element 1.

Specifically, in the present invention, it has been found that not only the composition of the materials for the information recording layer but also the form, i.e., aspect ratio of the information recording layer are important parameters for obtaining a desired asteroid curve, and the present invention has been completed, based on the above finding. The aspect ratio {(shorter axis length): (longer axis length)} is in the range of 1:1.2 to 1:3.5 as mentioned above. It has been found that, when the aspect ratio is 1: less than 1.2, a satisfactory sensitivity in the direction of the auxiliary magnetic field can be obtained, but the magnetic form anisotropy of the information recording layer is smaller and the magnetization becomes unstable, so that the inverted magnetic field is markedly unstable. In addition, it has been found that, when the aspect ratio is 1:more than 3.5, the inverted magnetic field tends to remarkably increase.

Further, it has been found that the magnetic anisotropy of the information recording layer is controlled by the form of the element and an elliptic form is most excellent from the viewpoint of obtaining good balance. As shown in FIGS. 2 and 3, for example, in the information recording layer having a substantially rectangular form shown in A6 of FIG. 3, the asteroid curve is wider as shown in B6 of FIG. 3 and has a larger slenderness ratio. By contrast, in the information recording layer having a rhombic form shown in A1 of FIG. 2, the asteroid curve has high anisotropy as shown in B1 of FIG. 2, and the asteroid curve tends to be linear. When the asteroid curve is linear, as mentioned above, the sensitivity in the direction of the auxiliary magnetic field becomes poor.

From the above, it is desired that the plane pattern of the information recording layer is in an elliptic form or an oval form, namely, as shown in A2 to A5 of FIGS. 2 and 3, a pattern form such that both sides thereof along the longer axis direction form a straight line or an outward protrusion, and the both ends thereof in the longer axis direction form a curved or bent outward form. The aspect ratio of the plane pattern is selected to fall in the range of 1:1.2 to 1:3.5 as mentioned above.

It has been found that, when the above requirement is satisfied, the sensitivity in the direction of the auxiliary magnetic field can be controlled, the slope of tangent line, i.e., curvature radius of the asteroid curve in a region of small auxiliary magnetic field is reduced and the asteroid curve is in an arch form, so that the form of the asteroid curve can be adjusted to be close to an ideal asteroid curve. Thus, the above-mentioned writable region can be enlarged, making it possible to considerably lower the write error.

In the example shown in FIG. 1, the magnetization fixed layer 5 has a single-layer structure, but the magnetization fixed layer 5 may have, for example, a ferromagnetic laminated ferri structure, of which one example is shown in the diagrammatic cross-sectional view of FIG. 4. In this example, on an antiferromagnetic layer 4 is deposited a first magnetization fixed layer 5a antiferromagnetically connected to the antiferromagnetic layer 4, and a second magnetization fixed layer 5b is stacked thereon through a nonmagnetic conductive layer 5c. The nonmagnetic conductive layer 5c may be comprised of a metallic film of, for example, Ru, Cu, Cr, Au, or Ag. In FIG. 1 and FIG. 4, like parts or portions are indicated by like reference numerals, and repetition of the description is avoided.

In the above example, the element has a TMR element construction in which the intermediate layer 6 is comprised of a tunnel barrier layer, but the element can be a spin-valve magnetoresistive element, i.e., so-called GMR having a so-called current perpendicular to plane (CPP) construction such that the intermediate layer 6 is comprised of a nonmagnetic conductive layer and a current flows in the thicknesswise direction.

Next, the embodiment of the magnetic memory unit of the present invention will be described, but the magnetic memory unit of the present invention is not limited to this embodiment.

Magnetic Memory Unit

The magnetic memory unit of the present invention includes the magnetoresistive element of the present invention having the above-described construction, for example, a TMR element as a memory device constituting a memory cell. The main part of one example of the magnetic memory unit is shown in, for example, a diagrammatic perspective view of FIG. 5, and the magnetic memory unit may have a cross-point MRAM array structure and one of memory cells 11 is shown in a diagrammatic cross-sectional view of FIG. 6.

Specifically, this MRAM has a plurality of word lines WL which are parallel, and a plurality of bit lines BL which are parallel and individually spatially cross the respective word lines WL, and, in portions at which the word lines WL and the bit lines BL spatially cross, as a memory cell 11, the magnetoresistive element of the present invention, for example, a TMR element 1 is disposed. FIG. 5 shows a part of the magnetic memory unit in which 3×3 memory cells 11 are arranged in a matrix form.

In each memory cell 11, as shown in FIG. 6, on a semiconductor substrate 2 comprised of, for example, a silicon substrate, that is, on a semiconductor wafer, a switching transistor 13 is formed. The transistor 13 is comprised of, for example, a MOS transistor (insulated gate field effect transistor). In this case, a gate insulating layer 14 is formed on the semiconductor substrate 2, and an insulating gate portion having a gate electrode 15 deposited thereon is formed on the gate insulating layer 14. Further, on the semiconductor substrate 2, a source region 16 and a drain region 17 are formed on both sides of the insulating gate portion. In this construction, the gate electrode 15 constitutes a reading word line WL1.

On the semiconductor substrate 2 having the transistor 13 formed, a first interlayer dielectric layer 31 is formed over the gate electrode 15, and contact holes 18 are individually formed in the first interlayer dielectric layer 31 above the source region 16 and the drain region 17 so that each hole penetrates the interlayer dielectric layer 31, and each contact hole 18 is filled with a conductive plug 19. On the first interlayer dielectric layer 31, a wiring layer 20 for the source region 16 is deposited over the conductive plug 19 in contact with the source region 16.

Further, on the first interlayer dielectric layer 31, a second interlayer dielectric layer 32 is formed over the wiring layer 20. A contact hole 18 is formed in the second interlayer dielectric layer 32 above the conductive plug 19 in contact with the drain region 17 so that the hole penetrates the second interlayer dielectric layer 32, and the contact hole 18 is filled with a conductive plug 19.

On the second interlayer dielectric layer 32, a write word line WL2 corresponding to the word line WL shown in FIG. 5 is formed, for example, in the extension direction of the reading word line WL1. Further, on the second interlayer dielectric layer 32, a third interlayer dielectric layer 33 comprised of, for example, silicon oxide is formed over the write word line WL 2. A contact hole 18 is formed in the third interlayer dielectric layer 33 above the conductive plug 19 in contact with the drain region 17 so that the hole penetrates the third interlayer dielectric layer 33, and the contact hole 18 is filled with a conductive plug 19.

Then, a primary coat layer 3 comprised of a conductor, for example, Ta shown in FIG. 1 or FIG. 4 is formed on the third interlayer dielectric layer 33 so that the primary coat layer is in contact with the conductive plug 19 which penetrates the third interlayer dielectric layer 33, and on the primary coat layer 3 is formed a magnetoresistive element, for example, a TMR element 1.

Further, a forth interlayer dielectric layer 34 is formed over the primary coat layer 3 and the TMR element 1 on the primary coat layer 3, and a bit line BL is formed on the forth interlayer dielectric layer 34 so that the bit line BL crosses the write word line WL.

If desired, a not shown surface insulating layer is formed over the bit line BL. The first to forth interlayer dielectric layers and the surface insulating layer can be individually formed by, for example, a plasma CVD process.

The structure of the TMR element 1 as a magnetoresistive element and the production method therefor are according to the structure shown in FIG. 4 or FIG. 5 and the constituent materials and deposition process described in connection with the production method in the present invention. Specifically, the antiferromagnetic layer 4, the magnetization fixed layer 5 having a single-layer or a laminated ferri structure, and the intermediate layer 6 are individually formed by a sputtering process, and the intermediate layer 6 is subjected to oxidation treatment or nitriding treatment, and then the magnetization unfixed layer 7 and the protecting layer 8 are individually formed by a sputtering process.

Therefore, in this case, the ferromagnetic layer 5 as a magnetization fixed layer, and the ferromagnetic layer 7 as a magnetization unfixed layer, i.e., information recording layer are individually formed as an FeCoB or FeCoNiB amorphous layer. The memory cells 11 are arranged in a matrix form on the common semiconductor substrate 2, i.e., semiconductor wafer as shown in FIG. 4.

The semiconductor substrate 2 is subjected to thermal treatment in a magnetic field so that the antiferromagnetic layer 4 is regulated, that is, the antiferromagnetic layer 4 is magnetized in a predetermined direction, so that the magnetization in the magnetization fixed layer 5 comprised of a ferromagnetic layer, which is in contact with and antifetromagnetically connected to the antiferromagnetic layer 4, can be fixed in one direction.

In the magnetic memory unit having the above construction, by permitting a predetermined current to flow the bit line BL and the write word line WL (WL1) a predetermined write magnetic field due to synthesis of the magnetic fields generated by both the bit line BL and the write word line WL is applied to the magnetization unfixed layer in the magnetoresistive element as the memory cell 11, for example, TMR element 1 in the crossing portion selected, so that the magnetization in the magnetization unfixed layer is inverted as mentioned above, thus achieving recording of information.

In reading of the recording information, a predetermined on-voltage is applied to the gate electrode 15 of the transistor 13 in the memory cell selected for reading, i.e., reading word line WL1 so that the transistor 13 is in an on-state to permit a reading current to flow both the bit line BL and the wiring layer 20 in the source region 16 of the transistor 13, thus achieving reading.

In the above-described MRAM of the present invention, in the magnetoresistive element as a memory device, at least one of the ferromagnetic layers constituting the ferromagnetic tunnel junction, e.g., the ferromagnetic layer constituting an information recording layer contains the above-mentioned specific elements and has a plane form having a specific aspect ratio, and thus the TMR element as a memory device has extremely excellent TMR power and is remarkably improved in the stability of the memory operation. In addition, the MRAM of the present invention is improved in the bias voltage dependency of the TMR ratio, and therefore it is easy to distinguish the low resistance state from the high resistance state upon reading, thus lowering the error rate. Further, as shown in FIG. 7, a noise appearing on the R-H curve is considerably suppressed, thus improving the asteroid characteristics. Therefore, the write error can be lowered.

Curves 61 and 62 in FIG. 7 show TMR ratios (%) against the change of the external magnetic field with respect to, respectively, a TMR element having an information recording layer comprised of $CO_{72}Fe_8 B_{20}$ (atm.%) and a TMR element having an information recording layer comprised of $Co_{90}Fe_{10}$ (atm.%). The TMR ratio (%) is determined by the formula: $\{(R_{max}-R_{min})/R_{min}\}\times 100$ (%) wherein $R_{max}$ represents a maximum resistance value caused by the external magnetic field, and $R_{min}$ represents a minimum resistance value.

From a comparison between the curves 61 and 62, it is found that the TMR element having an information recording layer containing Fe, Co, and B is lowered in the coercive force while maintaining a high TMR ratio and improved in the squareness of the TMR ratio-magnetic field loop, and improved in the Barkhausen noise, as compared to the TMR element having an information recording layer comprising only Fe and Co.

The application of the magnetoresistive element of the present invention is not limited to the above-described memory device in an MRAM, but the magnetoresistive element can be applied to, for example, a magnetic head, a hard disc drive having a magnetic head, an integrated circuit chip, and further applied to a variety of electric appliances including a personal computer, a portable terminal, and a mobile phone.

In addition, the construction in the present invention can be modified or changed. For example, in the example shown in FIGS. 1 and 4, the element has a so-called bottom type construction such that the antiferromagnetic layer is disposed on the side of the lower layer, but the element may have a so-called top type construction such that the antiferromagnetic layer is disposed on the side of the upper layer.

Next, the magnetoresistive element of the present invention and the memory device in an MRAM will be described with reference to the following Examples and Comparative Examples.

EXAMPLES AND COMPARATIVE EXAMPLES

Elements for evaluation of the properties {hereinafter, frequently referred to as TEG (test element group)} were prepared for individual examples, and evaluation of the properties in the present invention Examples and Comparative Examples were conducted using the TEG's prepared.

In this case, as described with reference to FIG. 6, in an MRAM, in addition to a magnetoresistive element (TMR element) 1 as a memory device, a switching transistor 13 is formed, but, in this TEG, formation of the switching transistor 13 on a semiconductor substrate 2, i.e., a semiconductor wafer was omitted.

A diagrammatic plan view of the TEG is shown in FIG. 8, and FIG. 9 is a diagrammatic cross-sectional view of FIG. 8, taken along the line A—A, and, as shown in FIG. 9, a semiconductor substrate (semiconductor wafer) 2 having a thickness of 0.6 mm, and having an insulating layer 12 comprised of a thermal oxide film having a thickness of 2 µm formed on the surface of the substrate was prepared. A metallic film constituting a word line was formed on the semiconductor substrate 2 and pattern-etched by photolithography to form a word line WL extending in one direction. In this instance, in the etched portion other than the word line WL formed portion, the oxide film on the surface of the semiconductor substrate 2, i.e., the insulating layer 12 is etched in a depth of 5 nm.

A TMR element 1 was formed on part of the word line WL. In formation of the TMR element 1, first, a primary coat layer 3 comprised of a Ta layer having a thickness of 3 nm and a Cu layer having a thickness of 100 nm, an antiferromagnetic layer 4 comprised of a PtMn layer having a thickness of 20 nm, a magnetization fixed layer 5 comprised of a ferrimagnetic layer, which is comprised of a nonmagnetic conductive layer comprised of a CoFe layer having a thickness of 3 nm and a Ru layer having a thickness of 0.8 nm, and a CoFe layer having a thickness of 2.5 nm, an intermediate layer 6 obtained by subjecting Al having a thickness of 1 nm to oxidation treatment, a magnetization unfixed layer 7 comprised of an FeCoB layer having a thickness of 5 nm, and a protecting layer 8 comprised of a Ta layer having a thickness of 5 nm were formed successively from the side of the semiconductor substrate 2 so as to entirely cover the respective underlying layers.

The TMR element 1 is constituted by part of the thus formed laminated films, and therefore, on the TMR element 1 formation portion of the laminated films, a mask layer (not shown) is formed from a photoresist layer by photolithography. Using the mask layer as a mask for etching, the laminated films are etched by, for example, dry etching to form the TMR element 1 comprised of the laminated films. Then, on the mask layer comprised of a photoresist layer, $Al_2O_3$ is sputtered over the TMR element 1 so that the thickness of the $Al_2O_3$ sputtered becomes about 100 nm, and then the mask layer is removed and the insulating layer on the TMR element 1 is removed, namely, lift-off procedure is conducted so that the surface of the TMR 1 is exposed.

A metallic film is formed on the entire surface of the exposed TMR element 1 so that the metallic film is in contact with the TMR element, and then the metallic film is pattern-etched by photolithography to form a bit line BL. The bit line BL and the above-formed word line WL are individually comprised of a Cu layer and in a pattern such that they cross and extend in the individual directions.

The FeCoB composition of the ferromagnetic layer 7 constituting the magnetization unfixed layer, i.e., information recording layer was $Fe_8 Co_{72}B_{20}$ (atm.%). The CoFe composition of the ferromagnetic layer 5 constituting the magnetization fixed layer was $Co_{75}Fe_{25}$ (atm.%). A tunnel barrier layer as the intermediate layer 6 was formed as follows. First, an Al film was deposited by a DC sputtering process so that the thickness became 1 nm, and then the metallic Al film was subjected to plasma oxidation by inductive coupled plasma (ICP) under conditions such that the (oxygen gas): (argon gas) flow rate was 1:1 and the gas pressure in a chamber was 0.1 mTorr. The oxidation time varies depending on the ICP plasma power, but, in this example, the oxidation treatment was conducted for 30 seconds. Deposition of films other than the intermediate layer 6 was conducted using a DC magnetron sputtering process: The TMR element 1 was formed into an elliptic pattern such that the shorter axis was 0.5 µm and the longer axis was 1.0 µm.

The word line WL and the bit line BL were individually formed by forming a metallic film and patterning the metallic film by an Ar plasma etching process using photolithography. At both ends of each of the word line WL and the bit line BL, terminal pads 23, 24 were respectively formed as shown in FIG. 8. A number of TEG's were disposed on the common substrate 2.

In the TEG having the construction, the maximum current which can flow each of the word line and the bit line is 20 mA, and the magnetization inversion current is controlled to be 20 mA or less by adjusting the conditions for forming the TMR laminated film and the element.

The thus prepared TEG was subjected to thermal treatment in a magnetic field by means of an apparatus for thermal treatment in magnetic a field. This thermal treatment was made for regulating the antiferromagnetic layer 4 comprised of PtMn, thus constituting a ferromagnetic tunnel junction MTJ. In the thermal treatment in a magnetic field, the thermal treatment temperature was 270° C., the magnetic field strength was 10 kOe, and the thermal treatment time (specifically, heating retention time) was 2 hours.

TEG's (samples 1 to 20) were individually prepared in substantially the same manner as in the above-prepared TEG except that the material, thickness, and aspect ratio of the information recording layer in the magnetoresistive element and the form of the element were changed. A current was supplied to the individual TEG's from a current source, and the word line current and the bit line current were stepwise changed to determine an asteroid curve of each element. In this instance, the asteroid curves of 10,000 elements on the same chip, i.e., the same substrate 2 were put on one another to determine a writable range. For rendering zero the write error when putting the asteroid curves of 10,000 elements on one another, with respect to each of the direction of the inverted magnetic field and the direction of the auxiliary magnetic field, a region having a diameter of 3 mA is obtained in a probability of 100%.

In the TEG samples 1 to 20 prepared, samples 1 to 6 individually have an information recording layer in an elliptic form shown in A4 of FIG. 3 and an aspect ratio of 2.5, and the material for and the thickness of the ferromagnetic layer 7 in the individual samples 1 to 6 are shown in Table 1.

TABLE 1

| | Information recording layer | |
|---|---|---|
| Sample No. | Material | Thickness |
| 1 | $(Co\text{-}10\ Fe)_{80}B_{20}$ | 5 nm |
| 2 | $(Co\text{-}10\ Fe)_{75}B_{25}$ | 5 nm |
| 3 | $(Co\text{-}10\ Fe)_{70}B_{30}$ | 5 nm |
| 4 | Co-10 Fe | 4 nm |
| 5 | (Co-10 Fe)/NiFe | 1 nm/5 nm |
| 6 | Co-Zr-Nb-Ta | 5 nm |

In samples 1 to 20, samples 7 to 14 individually have an information recording layer which is in an elliptic form and has the same construction as that of the sample 2 shown in Table 1. The aspect ratios in the individual samples were selected to be the values listed in Table 2.

TABLE 2

| | Aspect ratio for element |
|---|---|
| Sample No. | Aspect ratio (Longer axis length/shorter axis length) |
| 7 | 1.0 |
| 8 | 1.2 |
| 9 | 1.7 |
| 10 | 2.2 |
| 11 | 2.7 |
| 12 | 3.2 |
| 13 | 3.5 |
| 14 | 3.7 |

Further, samples 15 to 20 individually have the film construction of the information recording layer shown in Table 2 and an aspect ratio of 2.5. The forms of the information recording layers in the individual samples were those listed in Table 3.

TABLE 3

| Sample No. | Form of element |
|---|---|
| 15 | Rhombic form (A1 of FIG. 2) |
| 16 | Hexagonal form (A3 of FIG. 2) |
| 17 | Lemon-like form (A2 of FIG. 2) |
| 18 | Elliptic form (A4 of FIG. 3) |
| 19 | Capsule form (A5 of FIG. 3) |
| 20 | Rectangular form (A6 of FIG. 3) |

With respect to each of the above samples, an asteroid curve was determined. A width of the dispersion in each asteroid curve was determined, in terms of $(\Delta Hc/Hc)\times 100$ (%). In FIG. 10, the dispersion in the asteroid curve is indicated by a distance between a broken line As1 outside the asteroid curve A and a broken line As2 inside the asteroid curve A. For rendering zero the error when putting the asteroid curves of 10,000 elements on one another, while taking the dispersion into consideration, it is necessary that the circular region indicated by a broken line permitted in each of the direction of the inverted magnetic field and the direction of the auxiliary magnetic field in the writable region "a" have a diameter φ of 3 mA or more, and the requirement for this is that $(\Delta Hc/Hc)\times 100$ (%) be less than 10%.

With respect to each sample, the value of $(\Delta Hc/Hc)\times 100$ (%), and the slenderness ratio and curvature of the asteroid curve are shown in Table 4. A slenderness ratio of 2.5 or less is needed, taking into consideration the efficiency of generation of magnetic fields from the word line and the bit line. The curvature of the asteroid curve was determined, in terms of an S1/S0 value. Specifically, for example, an area defined by a curve As1 shown in the first quadrant in FIG. 10 and a straight broken line "c" drawn between the both ends of the curve As1 was taken as S1, and an area of the triangle defined by the straight broken line "c" and a broken line "d" on the ordinate and the abscissa through the center of the asteroid curve was taken as S0, and an S1/S0 ratio was determined as the curvature of the asteroid curve.

For obtaining a region having a diameter of 3 mA in each of the direction of the inverted magnetic field and the direction of the auxiliary magnetic field, it is desired that the S1/S0 value is larger, and the boundary is 0.2 or more when $(\Delta Hc/Hc)\times 100$ (%) is less than 10%.

TABLE 4

| Sample No. | ΔHc/Hc (%) | Slenderness ratio of asteroid | Curvature of asteroid | Remarks |
|---|---|---|---|---|
| 1 | 8 | 1.1 | 0.32 | Present invention Example |
| 2 | 6 | 1.2 | 0.33 | Present invention Example |
| 3 | 7 | 1.2 | 0.32 | Present invention Example |
| 4 | 14 | 1.1 | 0.30 | Comparative Example |
| 5 | 16 | 1.1 | 0.30 | Comparative Example |
| 6 | 17 | 1.2 | 0.32 | Comparative Example |
| 7 | 21 | 1.0 | 0.36 | Comparative Example |
| 8 | 9 | 1.1 | 0.34 | Present invention Example |
| 9 | 9 | 1.2 | 0.33 | Present invention Example |
| 10 | 8 | 1.3 | 0.32 | Present invention Example |
| 11 | 7 | 1.4 | 0.29 | Present invention Example |
| 12 | 6 | 1.5 | 0.25 | Present invention Example |
| 13 | 6 | 1.6 | 0.22 | Present invention Example |
| 14 | 13 | 1.8 | 0.18 | Comparative Example |
| 15 | 5 | 1.0 | 0.05 | Comparative Example |
| 16 | 6 | 1.2 | 0.18 | Comparative Example |
| 17 | 6 | 1.4 | 0.28 | Present invention Example |
| 18 | 7 | 1.8 | 0.32 | Present invention Example |
| 19 | 8 | 2.3 | 0.30 | Present invention Example |
| 20 | 9 | 2.7 | 0.24 | Comparative Example |

From Table 4, it is found that, in the asteroid curves of 10,000 memory devices, a region having a diameter of 3 mA in each of the direction of the inverted magnetic field and the direction of the auxiliary magnetic field can be obtained. Specifically, in each of samples 1 to 3, samples 8 to 13, and samples 17 to 19 having a designation "Present invention Example" in the column entitled "Remarks" in Table 4, an MRAM having an operation range secured is constructed.

As mentioned above, in the present invention, at least the ferromagnetic layer as an information recording layer is comprised of an amorphous film of FeCoB or FeCoNiB containing B, and further the plane form and aspect ratio of the information recording layer are specified. Therefore, the squareness ratio in the R-H characteristics is excellent, and the spin polarizability is improved while suppressing an increase in the coercive force, i.e., inverted magnetic field, and hence a high TMR ratio can be obtained and a Barkhausen noise is suppressed, thus making it possible to stably obtain an asteroid curve having excellent properties of arched form.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. A magnetoresistive element comprising at least a pair of ferromagnetic layers stacked with having an intermediate layer inbetween so as to face each other, wherein said element achieves a change in the magnetic resistance by permitting an electric current to flow in the direction which crosses the plane of the stacked layers, wherein at least one of said ferromagnetic layers constituting an information recording layer has an amorphous structure comprising either a CoFeB alloy or a CoFeNiB alloy, wherein said information recording layer has a plane form having a longer axis in one direction wherein both sides of the plane form along the longer axis direction form one of a straight line and an outward protrusion and the both ends of the plane form in the longer axis direction form a outward protrusion, thereby forming a pattern form, wherein said pattern form has an aspect ratio in the range of 1:1.2 to 1:3.5, in terms of shorter axis length:longer axis length.

2. The magnetoresistive element according to claim 1, wherein the plane form of said information recording layer has symmetry with respect to the center axis in each of the longer axis direction and the shorter axis direction.

3. The magnetoresistive element according to claim 1, wherein, in the plane form of said information recording layer, both sides of the plane form along the longer axis direction form an elliptic form or an oval form which are curved or bent outward.

4. A magnetic memory unit having a word line and a bit line which spatially cross, and comprising a magnetoresistive element constituting a memory device in a portion at which the word line and the bit line spatially cross, wherein said magnetoresistive element comprises at least a pair of ferromagnetic layers stacked with having an intermediate layer inbetween so as to face each other, wherein said element achieves a change in the magnetic resistance by permitting an electric current to flow in the direction which crosses the plane of the stacked layers, wherein at least one of said ferromagnetic layers constituting an information recording layer has an amorphous structure comprising either a CoFeB alloy or a CoFeNiB alloy, wherein said information recording layer has a plane form having a longer axis in one direction wherein both sides of the plane form along the longer axis direction form one of a straight line and an outward protrusion, and the both ends of the plane form in the longer axis direction form an outward protrusion, thereby forming a pattern form, wherein said pattern form has an aspect ratio in the range of 1:1.2 to 1:3.5, in terms of shorter axis length: longer axis length.

5. The magnetic memory unit according to claim 4, wherein the plane form of said information recording layer has symmetry with respect to the center axis in each of the longer axis direction and the shorter axis direction.

6. The magnetic memory unit according to claim 4, wherein, in the plane form of said information recording layer, both sides of the plane form along the longer axis direction form an elliptic form or an oval form which are curved or bent outward.

* * * * *

UNITED STATES PATENT AND TRADEMARK OFFICE
CERTIFICATE OF CORRECTION

PATENT NO.    : 6,879,514 B2
DATED         : April 12, 2005
INVENTOR(S)   : Masanori Hosomi et al.

It is certified that error appears in the above-identified patent and that said Letters Patent is hereby corrected as shown below:

<u>Title page</u>,
Item [75], Inventors, the name of the fourth inventor should be -- Tetsuya Mizuguchi --.

Signed and Sealed this

Thirtieth Day of August, 2005

JON W. DUDAS
*Director of the United States Patent and Trademark Office*